(12) United States Patent
O'Keefe

(10) Patent No.: US 8,405,068 B2
(45) Date of Patent: Mar. 26, 2013

(54) REFLECTING LIGHT EMITTING STRUCTURE AND METHOD OF MANUFACTURE THEREOF

(75) Inventor: Matthew Francis O'Keefe, Newton Aycliffe (GB)

(73) Assignee: RFMD (UK) Limited, Newton Aycliffe (GB)

( * ) Notice: Subject to any disclaimer, the term of this patent is extended or adjusted under 35 U.S.C. 154(b) by 0 days.

(21) Appl. No.: 12/841,225

(22) Filed: Jul. 22, 2010

(65) Prior Publication Data

US 2011/0101300 A1    May 5, 2011

Related U.S. Application Data

(60) Provisional application No. 61/227,630, filed on Jul. 22, 2009.

(51) Int. Cl.
*H01L 31/052* (2006.01)

(52) U.S. Cl. ............ 257/22; 257/15; 257/E33.008; 257/E33.072; 438/42; 438/43

(58) Field of Classification Search ............ 257/14, 257/13, 15, 22, E33.008, E33.072; 438/32, 438/42, 43
See application file for complete search history.

(56) References Cited

U.S. PATENT DOCUMENTS

| | | | |
|---|---|---|---|
| 5,389,571 A | 2/1995 | Takeuchi et al. | |
| 5,764,673 A | 6/1998 | Kawazu et al. | |
| 5,914,501 A | 6/1999 | Antle et al. | |
| 6,133,589 A | 10/2000 | Krames et al. | |
| 6,376,864 B1 | 4/2002 | Wang | |
| 6,593,597 B2 | 7/2003 | Sheu | |
| 6,861,677 B2 | 3/2005 | Chen | |
| 7,015,512 B2 | 3/2006 | Park et al. | |
| 7,042,150 B2 * | 5/2006 | Yasuda | 313/498 |
| 7,053,420 B2 * | 5/2006 | Tadatomo et al. | 257/98 |
| 7,211,822 B2 * | 5/2007 | Nagahama et al. | 257/22 |
| 2003/0122139 A1 | 7/2003 | Meng et al. | |
| 2005/0271107 A1 | 12/2005 | Murakami et al. | |
| 2006/0043385 A1 | 3/2006 | Wang et al. | |
| 2006/0068601 A1 | 3/2006 | Lee et al. | |
| 2006/0243988 A1 | 11/2006 | Narukawa et al. | |

(Continued)

FOREIGN PATENT DOCUMENTS

| | | |
|---|---|---|
| EP | 1187229 A1 | 3/2002 |
| JP | 10-242584 A | 9/1998 |

(Continued)

OTHER PUBLICATIONS

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, pp. 1347-1350, vol. 2, IEEE.

(Continued)

*Primary Examiner* — Allan R Wilson

(74) *Attorney, Agent, or Firm* — Withrow & Terranova, P.L.L.C.

(57) ABSTRACT

A reflecting light emitting structure includes a substrate having a plurality of grooves formed in a first face of the substrate is disclosed. The first face is in a first crystallographic plane. Each of the plurality of grooves includes a first sidewall that is coplanar with a second crystallographic plane and a second sidewall that is coplanar with a third crystallographic plane. A buffer layer is provided on the substrate to reduce mechanical strain between the substrate and a light emitting diode (LED) fabricated on the buffer layer.

16 Claims, 4 Drawing Sheets

U.S. PATENT DOCUMENTS

| | | | |
|---|---|---|---|
| 2007/0093009 A1 | 4/2007 | Baptist et al. | |
| 2007/0295985 A1 | 12/2007 | Weeks, Jr. et al. | |
| 2008/0112448 A1* | 5/2008 | Ueda et al. | 372/44.011 |
| 2008/0121876 A1 | 5/2008 | Otsuka et al. | |
| 2008/0272382 A1* | 11/2008 | Kim et al. | 257/94 |
| 2008/0283821 A1 | 11/2008 | Park et al. | |
| 2010/0025657 A1* | 2/2010 | Nagahama et al. | 257/13 |
| 2010/0133567 A1* | 6/2010 | Son | 257/98 |
| 2011/0163342 A1* | 7/2011 | Kim et al. | 257/98 |

FOREIGN PATENT DOCUMENTS

| | | |
|---|---|---|
| JP | 2000-031535 A | 1/2000 |
| JP | 2003-332618 A | 11/2003 |
| WO | 2004/051707 A3 | 6/2004 |

OTHER PUBLICATIONS

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 2006, pp. 1406-1408, vol. 18, No. 13, IEEE.

Lee, S.J., "Study of photon extraction efficiency in InGaN light-emitting diodes depending on chip structures and chip-mount schemes," Optical Engineering, Jan. 2006, pp. 014601-1-014601-14, vol. 45, No. 1, SPIE.

Windisch, R. et al., "40% Efficient Thin-Film Surface-Textured Light-Emitting Diodes by Optimization of Natural Lithography," IEEE Transactions on Electron Devices, Jul. 2000, pp. 1492-1498, vol. 47, No. 7, IEEE.

Windisch, R. et al., "Impact of texture-enhanced transmission on high-efficiency surface-textured light-emitting diodes," Applied Physics Letters, Oct. 8, 2001, pp. 2315-2317, vol. 79, No. 15, IEEE.

United Kingdom Search Report for patent application GB 0902558.6 mailed Jun. 15, 2010, 2 pages.

Chang, S.J. et al., "Improved ESD protection by combining InGaN-GaN MQW LEDs with GaN Schottky diodes," IEEE Electron Device Letters, Mar. 2003, vol. 24, No. 3, pp. 129-131.

Wierer, J. et al., "High-power AlGaInN flip-chip light-emitting diodes," Applied Physics Letters, vol. 78 No. 22, May 28, 2001, pp. 3379-3381.

Hibbard, D.L. et al., "Low resistance high relectance contacts to p-GaN using oxidized Ni/Au and Al or Ag," Applied Physics Letters, vol. 83 No. 2, Jul. 14, 2003, pp. 311-313.

Shchekin, O.B. et al., "High performance thin-film flip-chip InGaN-GaN light-emitting diodes," Applied Physics Letters, vol. 89, Aug. 2006, 4 pages.

Chao, C-H., et al., "Theoretical demonstration of enhancement of light extraction of flip-chip GaN light-emitting diodes with photonic crystals," Applied Physics Letters, vol. 89, Aug. 2006, 4 pages.

Non-final Office Action for U.S. Appl. No. 12/841,257 mailed Jan. 5, 2012, 16 pages.

Non-final Office Action for U.S. Appl. No. 12/705,869 mailed Feb. 9, 2012, 14 pages.

Notice of Allowance for U.S. Appl. No. 12/705,869 mailed Jul. 19, 2012, 8 pages.

Examination report for British application 0902558.6 mailed Nov. 16, 2012, 5 pages.

* cited by examiner

REFLECTING LIGHT EMITTING STRUCTURE AND METHOD OF MANUFACTURE THEREOF

RELATED APPLICATIONS

This application claims the benefit of provisional patent application Ser. No. 61/227,630, filed Jul. 22, 2009, the disclosure of which is hereby incorporated herein by reference in its entirety. The application also relates to provisional patent application Ser. No. 61/227,624, filed Jul. 22, 2009, and to utility patent application Ser. No. 12/705,869 filed Feb. 15, 2010, now published as US 2010/0230656 A1, both of which are hereby incorporated herein by reference in their entireties.

FIELD OF THE DISCLOSURE

The present disclosure relates to a structure and fabrication method for a reflecting light emitting structure that includes a textured substrate, and in particular to a textured substrate having uniform grooves.

BACKGROUND OF THE DISCLOSURE

Prior art solid state lighting systems use gallium nitride (GaN) that is grown on 150 millimeter (mm) silicon (Si) wafers. Light extraction efficiency is often improved for light emitting diodes (LEDs) grown on sapphire or silicon carbide (SiC) by texturing a surface of the LED structure. The texturing improves light extraction efficiency by reducing internal reflections that occur at internal surfaces of the LED structure.

Si substrates are attractive over sapphire and SiC substrates due to being relatively less expensive than sapphire and SiC substrates. Moreover, Si substrates are attractive for GaN-based devices in that Si device manufacturing is based upon a mature Si device fabrication technology. However, relatively complex and expensive packaging is required to efficiently scatter light emissions from a GaN LED structure. Thus, there is a need for a reflecting light emitting structure that incorporates a Si substrate.

SUMMARY OF THE DISCLOSURE

The present disclosure provides a reflecting light emitting structure and method of manufacture that incorporates a silicon (Si) substrate having a uniformly textured surface. Light emissions from a light emitting diode (LED) are efficiently scattered by the uniformly textured surface of the Si substrate. The light reflecting structure of the present disclosure is particularly well suited for efficiently reflecting light generated by a gallium nitride (GaN) LED that emits blue light.

The disclosed reflecting light emitting structure includes a substrate having a first face and a second face, wherein the first face is in a first crystallographic plane. A plurality of grooves is formed in the first face of the substrate, wherein each of the plurality of grooves includes a first sidewall that is coplanar with a second crystallographic plane and a second sidewall that is coplanar with a third crystallographic plane. A buffer layer is provided on the substrate to reduce mechanical strain between the substrate and an LED fabricated on the buffer layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
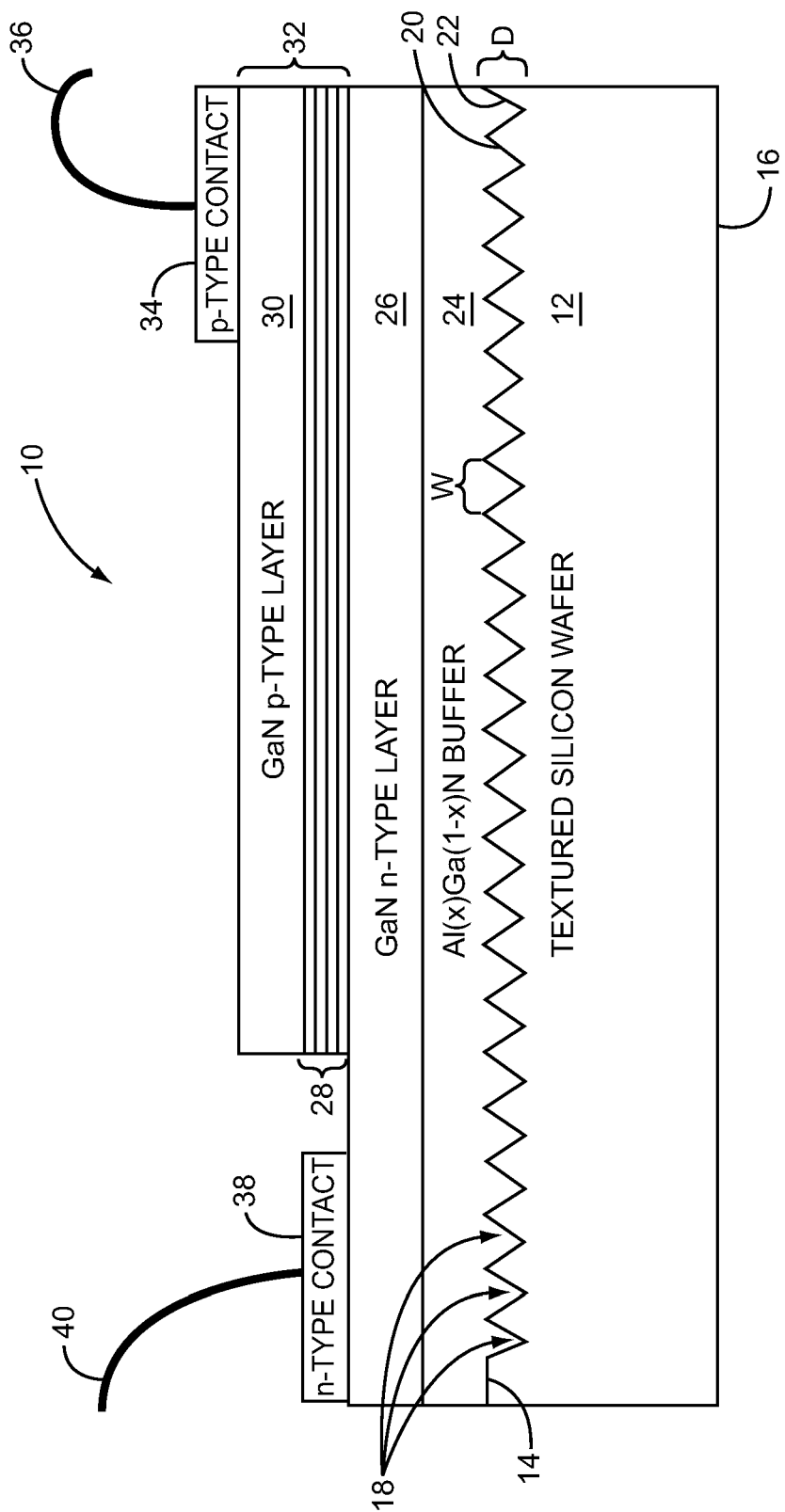
FIG. 1 is a cross-section view of one embodiment of a reflecting light emitting structure according to the present disclosure.

FIG. 1 provides a cross-section view of one embodiment of a reflecting light emitting structure 10 according to the present disclosure. The reflecting light emitting structure 10 includes a substrate 12 having a first face 14 and a second face 16. The substrate 12 is preferably made of a material that has a uniform crystalline structure. A silicon (Si) wafer like those commonly used in integrated circuit manufacturing is suitable as the substrate 12. A plurality of grooves 18 is fabricated into the first face 14 of the substrate 12. The plurality of grooves 18 is preferably anisotropically etched into the first face 14 of the substrate 12 using wet chemistry.

A wet chemistry etchant such as potassium hydroxide (KOH) is usable to etch the plurality of grooves 18. Due to the crystalline structure of the substrate 12, the plurality of grooves 18 has uniformity across the first face 14 of the substrate 12. As shown in FIG. 1, each of the plurality of grooves 18 includes a first sidewall 20 that is coplanar with a second crystallographic plane and a second sidewall 22 that is coplanar with a third crystallographic plane. The first sidewall 20 is inclined at a first slope with respect to the first face 14 of the substrate 12, and the second sidewall 22 is inclined at a second slope with respect to the first face 14 of the substrate 12. The first sidewall 20 intersects the second sidewall 22 to define a V-shape for each of the plurality of grooves 18 formed in the first face 14 of the substrate 12.

A channel width (W) and a depth (D) of each of the plurality of grooves 18 is controllable by the etchant concentration, the etchant temperature, and the etching duration. The dimension W is typically larger than a desired wavelength of a light emission produced by the reflecting light emitting structure 10. For a gallium nitride (GaN) light emission, the dimension W will have a range of 0.1 micrometers (μm) to 2 μm, and preferably around 0.5 μm. Both the dimensions W and D typically correspond to a single-digit number of wavelengths of the light emission.

Figure 2A:
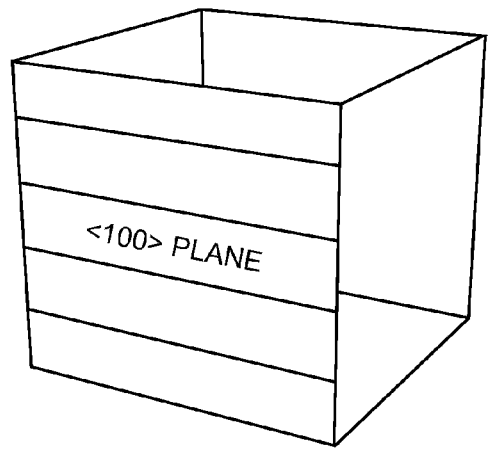
FIG. 2A is a unit cell for silicon (Si) that shows a <100> crystallographic plane.
Figure 2B:
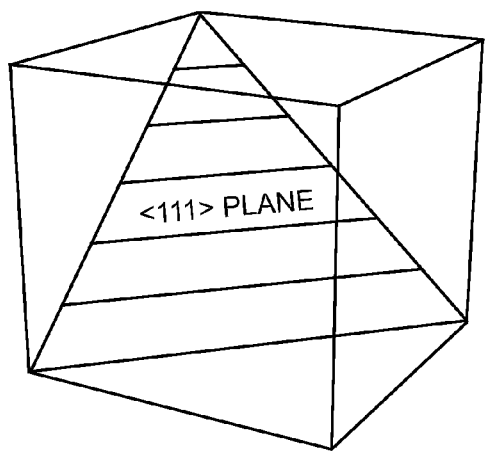
FIG. 2B is a unit cell for Si that shows a <111> crystallographic plane.
Figure 2C:
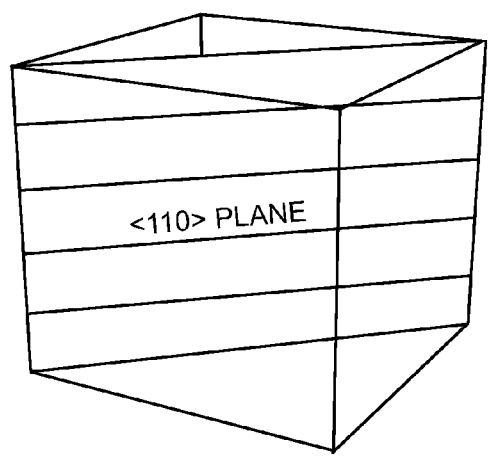
FIG. 2C is a unit cell for Si that shows a <110> crystallographic plane.

FIGS. 2A, 2B and 2C depict three typical crystallographic planes that are defined by Miller indices and unit cells for Si. In particular, FIG. 2A shows the <100> crystallographic plane that is usable as the first face 14 (FIG. 1) of the reflecting light emitting structure 10. Hydroxide chemistry may be used to etch the <100> crystallographic plane to expose a plurality of <111> planes. An orientation for a <111> plane is illustrated in FIG. 2B. A <111> plane slopes at an angle of approximately 54° with respect to a <100> plane.

The present disclosure is not limited to <100> and <111> crystallographic planes. Other crystallographic planes such as the <110> crystallographic planes may be used to form the plurality of grooves 18 (FIG. 1). A <110> plane slopes at an angle of 45° with respect to the <100> plane. Which particular crystallographic planes are exposed by wet chemistry etching is a function of concentration of etchants, etchant temperature, and etching duration among other factors that are well-known in the prior art. Even mechanical grinding can be used to exposed crystallographic planes to fabricate the plurality of grooves 18.

Turning back to FIG. 1, a buffer layer 24 is provided on the substrate 12. The buffer layer 24 may be grown or deposited on the substrate 12. The buffer layer 24 may comprise sub-layers of aluminum nitride (AlN) and various compounds of aluminum gallium nitride ($Al_xGa_{1-x}N$), wherein x is greater than zero but less than or equal to one. Alternately, the substrate 12 may comprise AlN. Further still, the substrate 12 may be made of a plurality of layers of $Al_xGa_{1-x}N$ ($0<x\leq1$).

A first doped layer 26 is provided on the buffer layer 24. The first doped layer 26 may be deposited or grown on the buffer layer 24. Preferably the first doped layer 26 is made of n-type GaN. A multiple quantum well (MQW) structure layer 28 is grown on the first doped layer 26, and a second doped layer 30 is deposited onto the MQW structure layer 28. The first doped layer 26, the MQW structure layer 28, and the second doped layer 30 make up a light emitting diode (LED) 32.

A first electrical contact 34 is provided on the second doped layer 30. The first electrical contact 34 and an associated bonding conductor 36 are usable to electrically couple the second doped layer 30 to an external circuit terminal (not shown). A second electrical contact 38 is provided on the first doped layer 26. The second electrical contact 38 and an associated bonding conductor 40 are usable to electrically couple the first doped layer 26 to another external circuit terminal (not shown).

Figure 3:
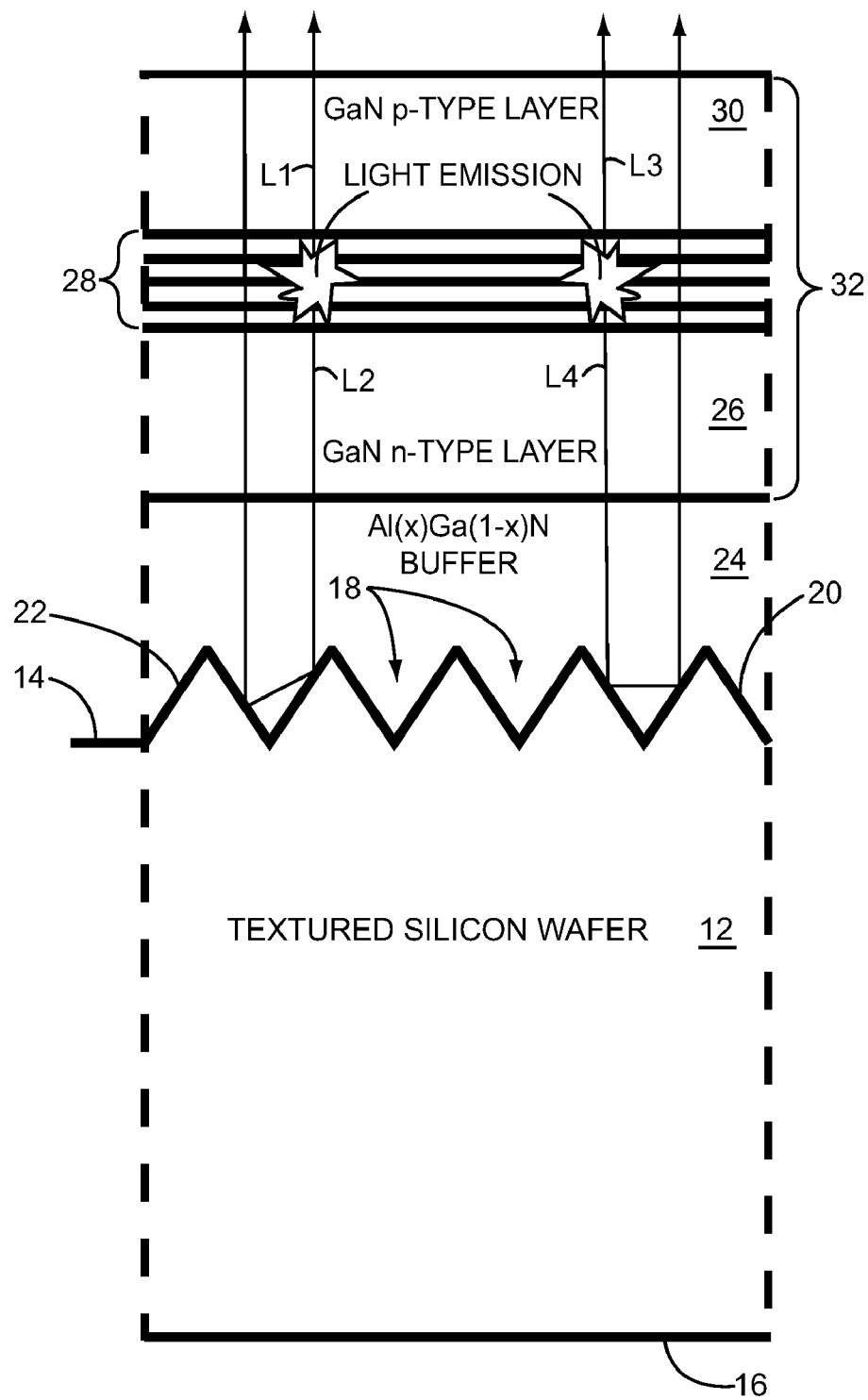
FIG. 3 depicts a section of the reflecting light emitting structure that illustrates the operation of the reflecting light structure according to the present disclosure.

FIG. 3 depicts a section of the reflecting light emitting structure 10 (FIG. 1) that illustrates the operation of the reflecting light emitting structure 10 according to the present disclosure. Light rays L1, L2, L3, and L4 are symbolic of the total light emission generated by the LED 32. The buffer layer 24, the first doped layer 26, and the second doped layer 30 are significantly non-opaque to the light rays L2 and L4. However, the substrate 12, being made of Si, is opaque to the light emission. Therefore light emission, such as that represented by light rays L2 and L4, that is initially directed towards the substrate 12 needs to be reflected back through the LED 32 in order not to be absorbed and wasted. The plurality of grooves 18 is ideal for reflecting and redirecting the light emission back through the LED 32 to open space. For example, a light emission produces the light ray L1, which propagates directly out of the LED 32 towards open space, but the light ray L2 initially propagates towards the substrate 12. However, the light ray L2 is reflected by the second sidewall 22 of one of the plurality of grooves 18. The first sidewall 20 of the same one of the plurality of grooves 18 reflects the light ray L2 through the LED 32 towards open space. In similar fashion, the light ray L4 is reflected and redirected towards open space in the direction of the light ray L3.

Figure 4:
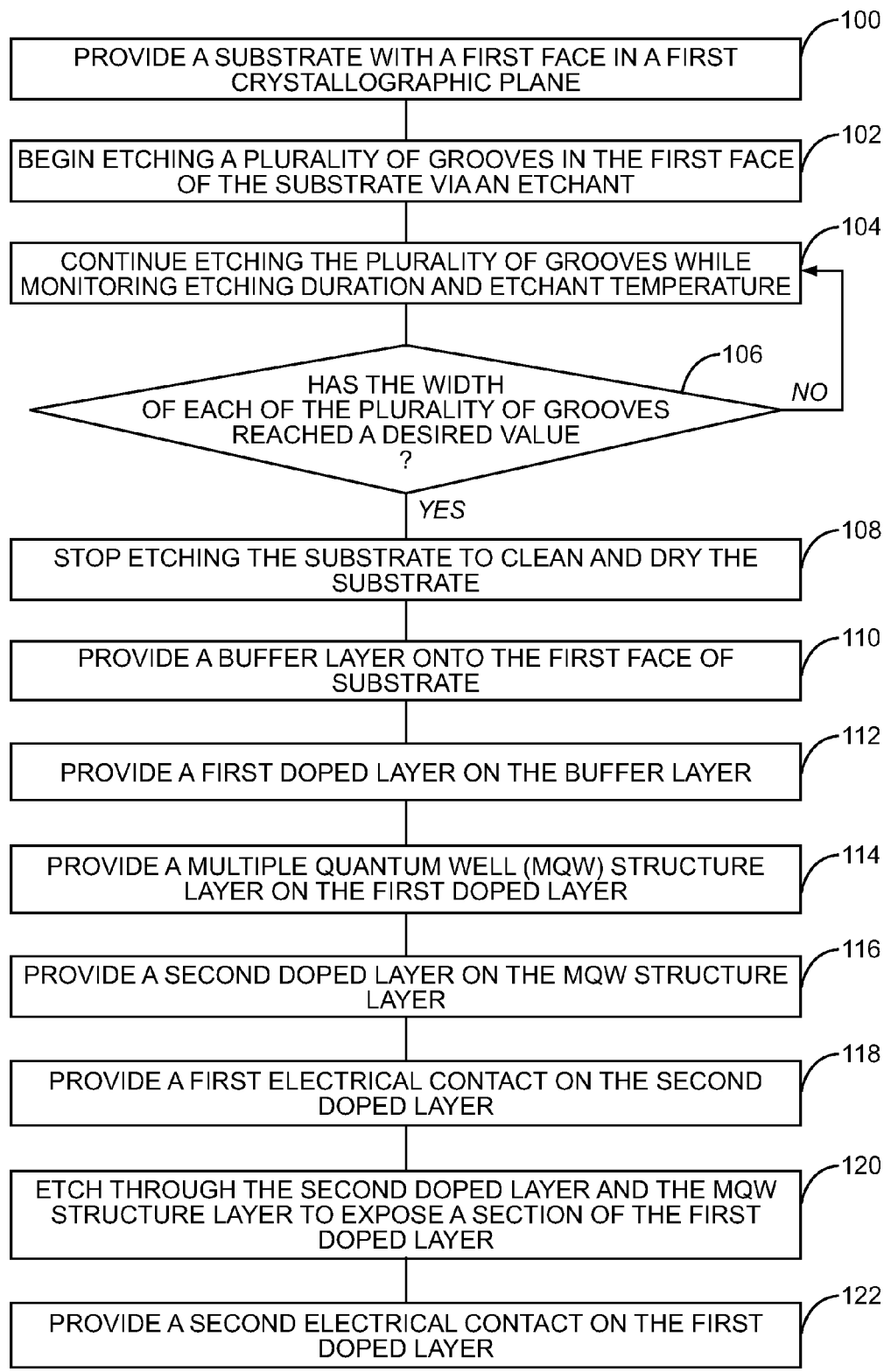
FIG. 4 is a flowchart of a method of manufacture for a reflecting light emitting structure according to the present disclosure.

FIG. 4 is a flowchart depicting a method of fabricating the reflecting light emitting structure 10 (FIG. 1). The method begins by providing the substrate 12 with the first face 14 in a first crystallographic plane in a first orientation (step 100). In a preferred embodiment, the substrate 12 is made of Si.

At this point, etching the plurality of grooves 18 in the first face 14 of the substrate 12 may begin (step 102). Preferably, an anisotropic wet etchant such as KOH is used to fabricate the first sidewall 20 and the second sidewall 22 of the plurality of grooves 18, such that each of the plurality of grooves 18 becomes uniform and regularly spaced with respect to each other as etching proceeds.

While the etching of the plurality of grooves 18 proceeds, the duration of the etching and temperature of the etchant is monitored (step 104). A determination is made as to when the W of each of the plurality of grooves 18 has reached a desired value based upon the etchant temperature, the concentration of etchant, and the duration of the etching process (step 106). If the desired value of width W of each of the plurality of grooves 18 has not been reached, the etching process continues with step 104. Otherwise, etching of the substrate 12 is stopped to clean and dry the substrate 12 (step 108).

Another step includes providing the buffer layer 24 on the first face 14 of the substrate 12 (step 110). The buffer layer 24 may be grown or deposited on the substrate 12. The buffer layer 24 may comprise sub-layers of AlN and various compounds of $Al_xGa_{1-x}N$, wherein x is greater than zero but less than or equal to one. Alternately, the buffer layer 24 may comprise only AlN. Further still, the buffer layer 24 may be made of a plurality of layers made of $Al_xGa_{1-x}N$ ($0<x\leq1$).

Other steps include fabricating the LED 32 (FIG. 1). The fabrication of the LED 32 begins by providing the first doped layer 26 on the buffer layer 24 (step 112). Preferably, the step 112 is accomplished by depositing or growing the first doped layer 26 on the buffer layer 24. It is also preferable for the first doped layer 26 to be made of n-type doped GaN.

In order to allow the reflecting light emitting structure 10 to emit light efficiently, a step of fabricating the MQW structure layer 28 onto the first doped layer 26 is performed using standard MQW fabrication technology (step 114).

Another step completes the LED 32 by providing the second doped layer 30 on the MQW structure layer 28 (step 116). The step 116 providing the second doped layer 30 is preferably accomplished by depositing or growing p-type doped GaN onto the MQW structure layer 28.

Next, a series of steps is performed to make electrical connections between external electrical circuitry (not shown) and the LED 32. These steps may begin by providing the first electrical contact 34 on the second doped layer 30 (step 118). The first electrical contact 34 is preferably made of a material that is the same type as the second doped layer 30. For example, if the second doped layer 30 is made of n-type material, then the first electrical contact 34 should also be made of n-type material.

A next step includes etching through the second doped layer 30 and the MQW structure layer 28 to expose a section of the first doped layer 26 (step 120). Another step involves providing the second electrical contact 38 on the first doped layer 26 (step 122).

Those skilled in the art will recognize improvements and modifications to the preferred embodiments of the present disclosure. All such improvements and modifications are considered within the scope of the concepts disclosed herein and the claims that follow.

What is claimed is:

1. A reflecting light emitting structure comprising:
a substrate having a first face and a second face, wherein the first face is in a first crystallographic plane;
a plurality of grooves formed in the first face of the substrate, wherein each of the plurality of grooves includes a first sidewall that is coplanar with a second crystallographic plane and a second sidewall that is coplanar with a third crystallographic plane;
a buffer layer provided on the substrate, wherein the buffer layer is made of $Al_xGa_{1-x}N$ ($0<x\leq1$); and
a light emitting diode (LED) fabricated on the buffer layer, the LED comprising:
a first doped layer fabricated directly onto the buffer layer;
a multiple quantum well (MQW) structure layer fabricated directly onto the first doped layer; and
a second doped layer fabricated directly onto the MQW structure layer, and
wherein the buffer layer comprises a first sub-layer of aluminum nitride (AlN) and a second sub-layer of aluminum gallium nitride ($Al_xGa_{1-x}N$) ($0<x\leq1$).

2. The reflecting light emitting structure of claim 1 wherein the substrate comprises silicon (Si).

3. The reflecting light emitting structure of claim 1 wherein the first sidewall is inclined at a first slope with respect to the first face of the substrate.

4. The reflecting light emitting structure of claim 3 wherein the second sidewall is inclined at a second slope with respect to the first face of the substrate.

5. The reflecting light emitting structure of claim 4 wherein the first sidewall intersects the second sidewall to define a V-shape for the each of the plurality of grooves formed in the first face of the substrate.

6. The reflecting light emitting structure of claim 1 wherein the first crystallographic plane is a <100>plane and the second crystallographic plane and the third crystallographic plane are <111>planes.

7. The reflecting light emitting structure of claim 1 wherein a minimum channel width of the each of the plurality of grooves is two to ten times greater than a desired wavelength of a light emission of the LED.

8. The reflecting light emitting structure of claim 7 wherein the minimum channel width of the each of the plurality of grooves is within a range of 0.1 micrometers (μm) to 2 μm.

9. The reflecting light emitting structure of claim 1 wherein the first doped layer is made of n-doped gallium nitride (GaN).

10. The reflecting light emitting structure of claim 1 wherein the second doped layer is made of p-doped GaN.

11. The reflecting light emitting structure of claim 1 wherein the buffer layer is deposited or grown on the first face of the substrate.

12. A method of fabricating a reflecting light emitting structure, the method comprising:
providing a substrate having a first face and a second face, wherein the first face is in a first crystallographic plane;
fabricating a plurality of grooves in the first face of the substrate, wherein each of the plurality of grooves includes a first sidewall that is coplanar with a second crystallographic plane and a second sidewall that is coplanar with a third crystallographic plane;
depositing or growing a buffer layer provided on the substrate, wherein the buffer layer is made of $Al_xGa_{1-x}N$ ($0<x\leq1$); and
fabricating a light emitting diode (LED) directly on the buffer layer, wherein fabricating the LED comprises:
fabricating a first doped layer directly onto the buffer layer;
fabricating a multiple quantum well (MQW) structure layer directly onto the first doped layer; and
fabricating a second doped layer directly onto the MQW structure layer, and
wherein the buffer layer comprises a first sub-layer of aluminum nitride (AlN) and a second sub-layer of aluminum gallium nitride ($Al_xGa_{1-x}N$) ($0<x\leq1$).

13. The method of claim 12 wherein the substrate comprises Si.

14. The method of claim 12 wherein the first sidewall intersects the second sidewall to define a V-shape for the each of the plurality of grooves formed in the first face of the substrate.

15. The method of claim 12 wherein fabricating the plurality of grooves is accomplished using a wet chemistry etchant.

16. The method of claim 15 wherein the wet chemistry etchant is potassium hydroxide (KOH).

* * * * *